(12) United States Patent
Horch

(10) Patent No.: US 7,351,614 B1
(45) Date of Patent: Apr. 1, 2008

(54) DEEP TRENCH ISOLATION FOR THYRISTOR-BASED SEMICONDUCTOR DEVICE

(75) Inventor: Andrew Horch, Sunnyvale, CA (US)

(73) Assignee: T-Ram Semiconductor, Inc., Milpitas, CA (US)

( * ) Notice: Subject to any disclaimer, the term of this patent is extended or adjusted under 35 U.S.C. 154(b) by 364 days.

(21) Appl. No.: 11/230,897

(22) Filed: Sep. 20, 2005

Related U.S. Application Data

(62) Division of application No. 10/263,376, filed on Oct. 1, 2002, now Pat. No. 6,953,953.

(51) Int. Cl.
*H01L 21/332* (2006.01)

(52) U.S. Cl. ............ 438/135; 438/133; 438/136; 438/137; 438/138; 438/139

(58) Field of Classification Search ............ 438/133, 438/135–139
See application file for complete search history.

(56) References Cited

U.S. PATENT DOCUMENTS

| | | | |
|---|---|---|---|
| 6,104,045 A | 8/2000 | Forbes et al. | |
| 6,225,165 B1 | 5/2001 | Noble, Jr. et al. | |
| 6,229,161 B1 | 5/2001 | Nemati et al. | |
| 6,727,528 B1 * | 4/2004 | Robins et al. ............ | 257/133 |
| 6,906,354 B2 * | 6/2005 | Hsu et al. ............... | 257/107 |

OTHER PUBLICATIONS

Stanley Wolf Ph.D. and Richard N. Tauber Ph.D., "Silicon Processing for the VLSI Era," vol. 1, 1986, pp. 285-286.
S.M. Sze, Physics of Semiconductor Devices, A Wiley-Interscience Publication, Second Edition, 1981, pp. 397 and 442.
Ponomarev et al., High-Performance Deep SubMicron CMOS Technologies with Polycrystalline-SeGe Gates, IEEE Transactions on Electronic Devices, vol. 47, No. 4, pp. 848-855, Apr. 2000.
Ponomarev et al., A 0.13um Poly-SiGe Gate CMOS Technology for Low-Voltage Mixed-Signal Applications, IEEE Transactions on Electronic Devices, vol. 47, No. 7, pp. 1507-1513, Jul. 2000.
Ponomarev et al., Gate-Workfunction Engineering Using Poly-(Se, Ge) for High-Performance 0.18 um CMOS Technology, IEDM Tech. Dig., pp. 829-832, 1997.

* cited by examiner

*Primary Examiner*—Zandra V. Smith
*Assistant Examiner*—Bac H. Au
(74) *Attorney, Agent, or Firm*—H C Chan, Esq.

(57) ABSTRACT

A thyristor-based semiconductor device includes a filled trench separating and electrically insulating adjacent thyristor control ports. According to an example embodiment of the present invention, the filled trench is formed in a substrate adjacent to at least one thyristor body region. The filled trench includes a conductive filler material, an insulative material formed on the conductive filler material and at least two laterally-adjacent thyristor control ports separated from one another by the conductive filler material and the insulative material. One of the control ports is adapted for capacitively coupling to the thyristor body region for controlling current in the thyristor. With this approach, two or more control ports can be formed in a single filled trench and electrically isolated by the conductive filler material/insulative material combination. In addition, the single filled trench can further be used to electrically isolate other circuitry, such as conductive shunts to buried circuit nodes in the substrate. These approaches are particularly useful, for example, in high-density applications where insulative trenches having high aspect ratios are desired (e.g., where it is difficult to fill lower portions of the trench with insulative material), and for reducing manufacturing complexity.

9 Claims, 5 Drawing Sheets

DEEP TRENCH ISOLATION FOR THYRISTOR-BASED SEMICONDUCTOR DEVICE

RELATED PATENT DOCUMENTS

This patent application is a divisional of patent application Ser. No. 10/263,376 filed Oct. 1, 2002 now U.S. Pat. No. 6,953,953, which is incorporated herein by reference. The present invention is related to U.S. patent application Ser. No. 10/262,792 entitled "Method of Manufacturing a Thyristor Device with a Control Port in a Trench" and filed on Oct. 1, 2002, which is fully incorporated herein by reference.

FIELD OF THE INVENTION

The present invention is directed to semiconductor devices and, more specifically, to semiconductor devices having thyristor-based devices and thyristor.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that capacitive coupling between a control port and a thyristor base region can substantially modulate the potential of the base region. For memory-cell applications, another important consideration in semiconductor device design, including those employing thin capacitively-coupled thyristor-type devices, includes forming devices in a very dense array.

In order to achieve a dense array of thyristor devices, it is sometimes desirable to form trenches having a very high aspect ratio (the ratio of height-to-width of the opening of the trench). However, commonly used insulative materials are difficult to implement when filling trenches having an aspect ratio of greater than 2:1. For instance, many insulative materials tend to fill in an upper cross-section of a trench before lower portions of the trench are filled, which can result in voids in the insulative material near the trench bottom. In addition, when isolating adjacent circuitry, it is sometimes difficult to use a single trench for isolating multiple devices, such as a pass gate and a thyristor device. For example, in memory arrays, it is difficult to isolate word lines in adjacent memory cells. Furthermore, when implementing adjacent trenches having varied depths, tapering effects can cause an upper portion of a trench to be wider than a lower portion thereof. Such tapering can result in undesirable substrate material between the two trenches, which can allow current leakage from circuit devices formed in and/or adjacent to the trenches.

These and other design considerations have presented challenges to implement such a thin capacitively-coupled thyristor in bulk substrate applications, and in particular to highly-dense applications.

SUMMARY

The present invention is directed to overcoming the above-mentioned challenges and others related to the types of devices and applications discussed above and in other circuits. The present invention is exemplified in a number of implementations and applications, some of which are summarized below.

According to an example embodiment of the present invention, a semiconductor device includes a filled trench having two or more thyristor control ports separated and electrically isolated by a conductive filler material having an insulative liner formed thereon. The control ports are electrically insulated from the conductive material by the insulative liner.

Consistent with the above example embodiment, for certain applications, implementations can include adjacent thyristor control ports in a single trench while being electrically isolated in a readily manufactured arrangement. In addition, the adjacent thyristor control ports can be formed in close proximity, promoting application of the semiconductor device to high-density circuit arrangements.

In a more particular example embodiment of the present invention, the filled trench discussed above is formed below an upper surface of a substrate having at least one thyristor body region buried therein. The filled trench is laterally adjacent to the thyristor body region(s) and one of the control ports is configured and arranged for capacitively coupling to the thyristor body region for controlling current flow therein.

In another more particular example embodiment of the present invention, the conductive filler material discussed above is filled in the trench, masked and subsequently etched, forming upper and lower portions thereof. The insulative liner is then formed on a top surface and on sidewalls respectively of the lower and upper portions of the conductive filler material. The control ports are then formed in the trench and on the insulative liner. With this approach, the filled trench can be implemented for electrically isolating the control ports as well as other circuitry without necessarily requiring separate trench etch steps.

In another example embodiment of the present invention, a memory array comprises a plurality of memory cells, each memory cell having a thyristor coupled in series with a pass device, with a filled trench having a conductive filler material and insulative material disposed between adjacent thyristor control ports. Each pass device is coupled to a bit line, and each thyristor is coupled to a reference voltage line. The filled trench electrically insulates pass devices in adjacent memory cells that share common thyristor control ports and further electrically insulates thyristor control ports in adjacent memory cells sharing common bit lines.

Consistent with the example embodiment in the preceding paragraph, for certain applications, implementations can include a single trench for isolating adjacent thyristor control ports, avoiding difficulties such as trench tapering that tend to occur when multiple trenches are used. In addition, this approach is particularly useful in applications where it is desirable to fill a lower portion of a trench with conductive filler material, such as memory applications benefiting from high-density circuit arrangements.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
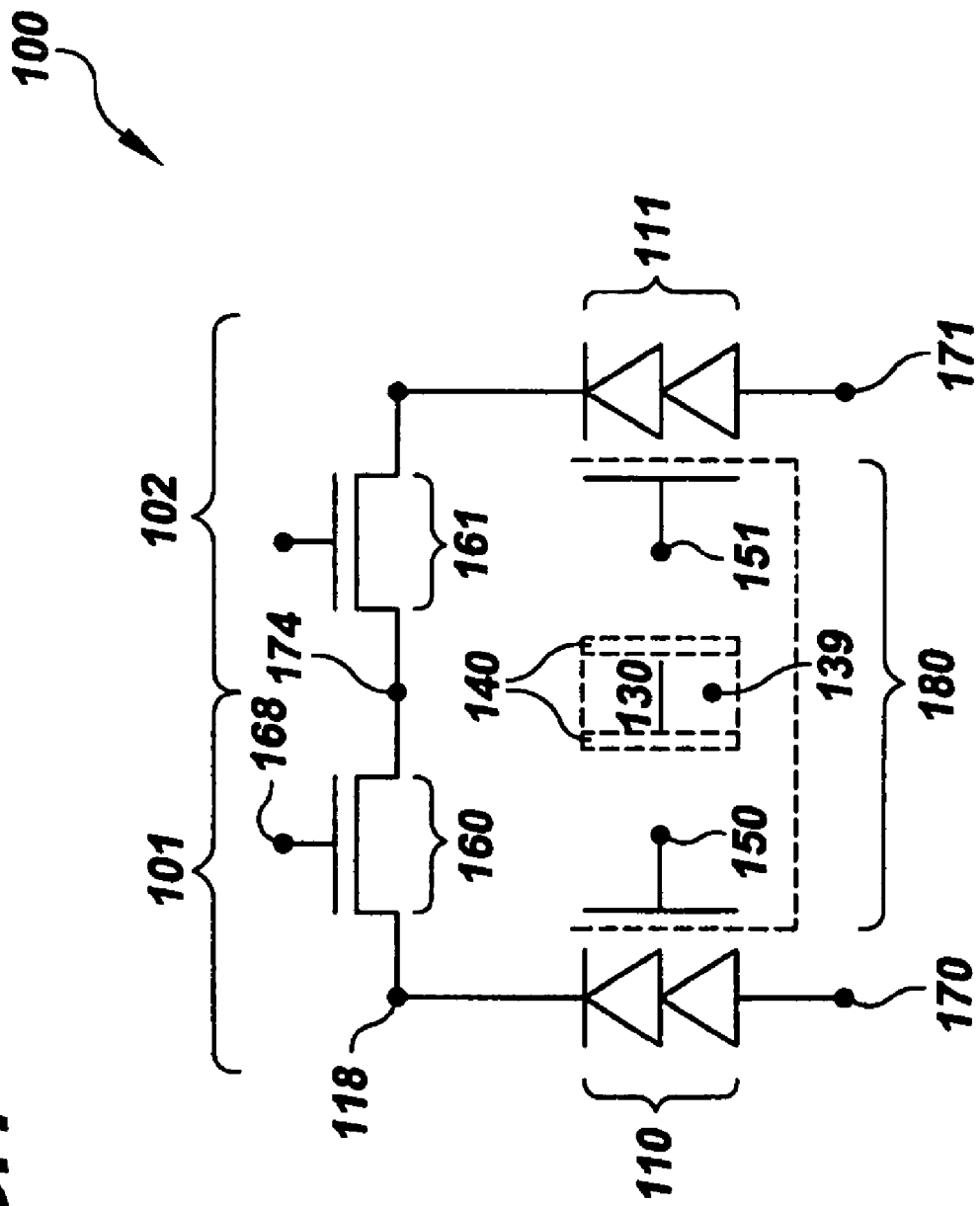
FIG. 1 is a circuit schematic, according to an example embodiment of the present invention, along with a cut-away view of a portion of the corresponding semiconductor device in which adjacent thyristor control ports are shown within a trench.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for high-density thyristor and current-switching applications. While the present invention is not necessarily limited to such applications, various aspects of the invention may be appreciated through a discussion of various examples using this context.

According to an example embodiment of the present invention, a trench is formed in a semiconductor substrate and adjacent to a thyristor body region that is also in the substrate. The trench is lined with an insulative material and a portion of the lined trench is filled with a conductive filler material, such as polysilicon. An insulative material is then formed on the conductive filler material and two laterally-adjacent thyristor control ports are formed on opposite sides of a portion of the insulative material. One of the control ports is adapted for capacitively coupling to the thyristor body region in the substrate for controlling current flow therein. The insulative and conductive filler materials electrically insulate the laterally-adjacent thyristor control ports from each other.

In another implementation, the conductive filler material discussed above also extends below the laterally-adjacent control ports. In this implementation, the conductive filler material is formed in the lined trench, a first upper portion of the conductive filler material that is to separate the laterally-adjacent control ports is masked, and a second lower portion (unmasked) of the conductive filler material is etched. Insulative liner material is formed on an upper surface of the etched second lower portion and on vertical sidewalls of the first upper portion, and the laterally-adjacent control ports are formed on the insulative liner material, laterally-adjacent to the first upper portion and over the etched second lower portion. This approach results in the control ports being laterally separated by the upper portion of the conductive filler material and insulative liner material formed thereon.

In a more particular implementation, the insulative and conductive filler materials discussed above are further adapted to electrically insulate the thyristor control ports from other circuitry in the device, such as additional control ports, transistors and interconnects. In another implementation, the insulative and conductive filler materials also insulate the thyristor body region in the substrate from other circuitry in the device, such as other thyristors, control ports, transistors and interconnects.

In another more particular implementation, the conductive filler material is recessed sufficiently below an upper surface of the substrate such that insulative material formed thereon is deep enough to electrically insulate circuitry in the substrate. For example, when implemented in connection with a transistor having source/drain regions in the substrate, the conductive filler material is recessed below the source/drain regions. Insulative material is then formed over the conductive filler material and adjacent to the source/drain regions, thereby electrically isolating the source/drain regions from adjacent circuitry (e.g., circuitry across the trench from the source/drain regions).

In another example embodiment of the present invention, adjacent portions of thyristor-based memory cells are electrically isolated using a filled trench having a conductive filler material, for example, using an approach consistent with one or more of those discussed above. The memory cells each include a thyristor coupled to a pass device, such as a transistor or other current-switching structure. In this example, conductive filler material and insulative material in the filled trench electrically insulate adjacent thyristor control ports as well as active regions (e.g., source/drain regions) of adjacent pass devices. With this approach, a single trench can be used to electrically isolate both thyristor control ports and other circuitry in adjacent memory cells. In addition, a particular memory cell can be electrically isolated from adjacent memory cells in adjacent rows and in adjacent columns using the same trench.

The above approaches are particularly useful for filling trenches having high aspect ratios (e.g., height:width aspect ratios of 2:1 or higher), wherein typical insulative materials generally do not adequately fill lower portions of the trenches, as discussed in the background above. In this regard, high density thyristor-based switching circuits and memory can be implemented in a readily manufactured arrangement using these approaches as well as others shown in the figures and discussed below.

FIG. 1 shows a circuit 100 having two adjacent memory cells 101 and 102 respectively including thyristor control ports 150 and 151, according to another example embodiment of the present invention. The control ports 150 and 151 are located in a trench 180, shown in an overlay representation with dashed lines, having a conductive material 130 and insulative material 140 that separate and electrically insulate the control ports from one another. The conductive material 130 is optionally contacted via contact 139 to an external node, such as a ground or line voltage, for maintaining the conductive material at a selected voltage. Memory cells 101 and 102 are shown in an essentially mirrored arrangement, with repetitive discussion of certain similar elements omitted for brevity.

Referring to memory cell 101 as a representative example of both cells 101 and 102, a thyristor includes a body region 110 and a control port 150. The thyristor body region 110 is coupled to a pass device 160, such as a transistor, with a data storage node 118 disposed between the body region and the pass device. Control port 150 is adapted for capacitively coupling to the thyristor body region 110 for controlling current flow therein, and a gate 168 is similarly adapted for controlling current flow in the pass device 160. A reference voltage (Vref) node 170 is coupled to an emitter region of the thyristor body 110 and a similar Vref node 171 is coupled to thyristor body 111 of memory cell 102. A bit line contact 174 is electrically coupled to a source/drain region of the pass device 160 and to a source/drain region of pass device 161 of memory cell 102. In response to signals applied to the control port 150 and gate 168, and using signals at the bit line contact 174 and Vref node 170, the circuit 100 is adapted for writing data to and/or reading data from the storage node 118.

Some of the example embodiments and implementations described below in connection with the figures share similar features with each other and with FIG. 1. In each of these similarly-illustrated examples and implementations, certain discussion of similar features that are similarly numbered is omitted for brevity.

Figure 2:
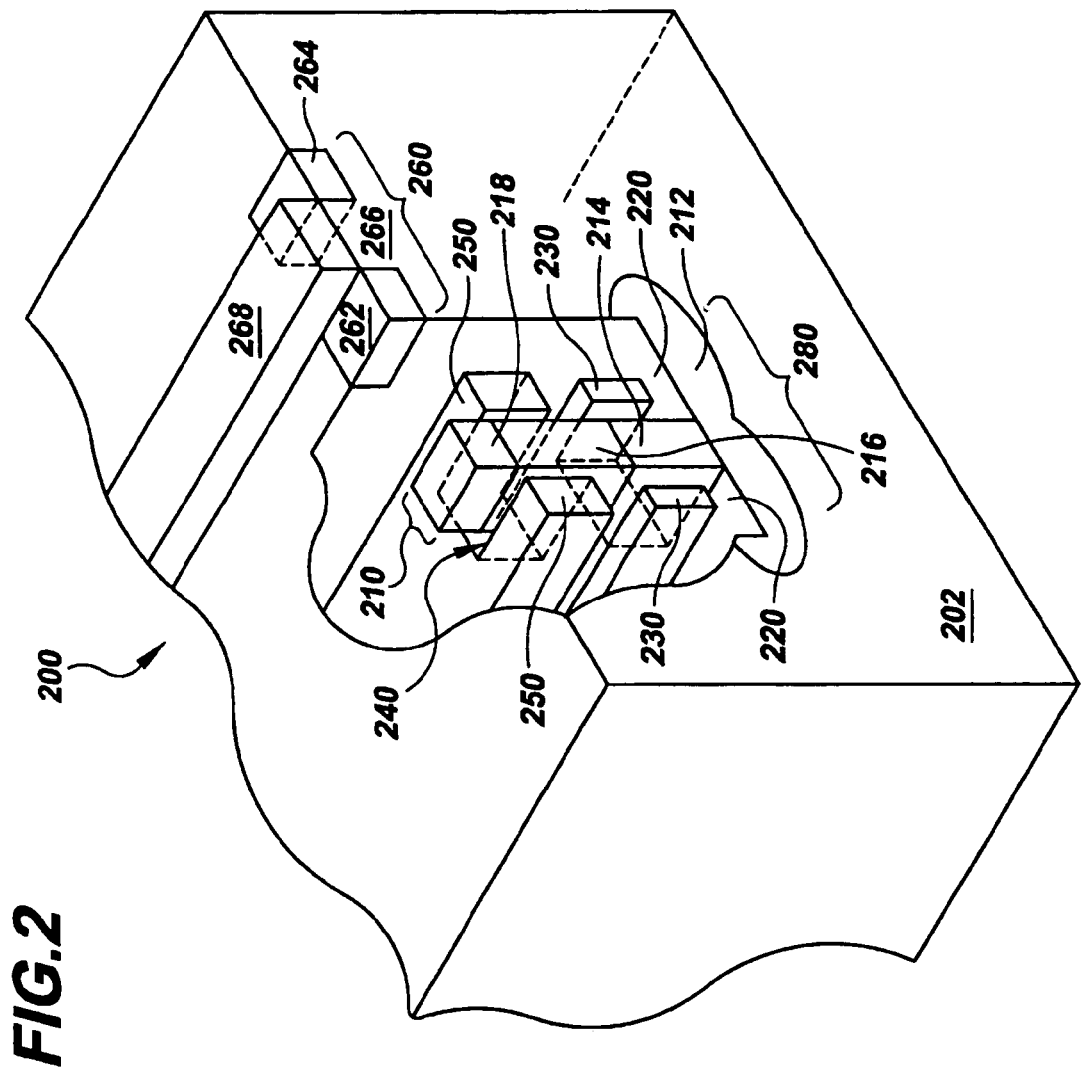
FIG. 2 is a cut-away view of a thyristor-based semiconductor device, similar to that shown in FIG. 1, according to another example embodiment of the present invention.

FIG. 2 is a cut-away view of a circuit arrangement 200 that may be implemented in connection with memory cell 101 of FIG. 1 above and/or cross-section A of FIG. 3, below, according to another example embodiment of the present invention. The circuit arrangement 200 includes a thyristor having a body 210 and a control port 250 around the body and adapted for capacitively coupling to the body for controlling current flow therein. The thyristor body 210 includes an implanted P+ emitter region 212, N base region 214, P base region 216 and N+ emitter region 218. A pass device 260 includes source/drain regions 262 and 264 separated by a channel region 266, with a gate 268 over the channel region 266 and adapted for switching the device 260 between current passing and current blocking states. The source/drain region 262 is coupled via a local interconnect (not shown) to the N+ emitter region 218.

A filled trench region 280 in a P-doped substrate 202 and around a thyristor body region 210 includes conductive filler material 230 with insulative material 220 formed thereon. The control port 250 is also in the filled trench 280, with the control port being adapted for capacitively coupling to P base region 216 via insulative material 240.

Figure 3:
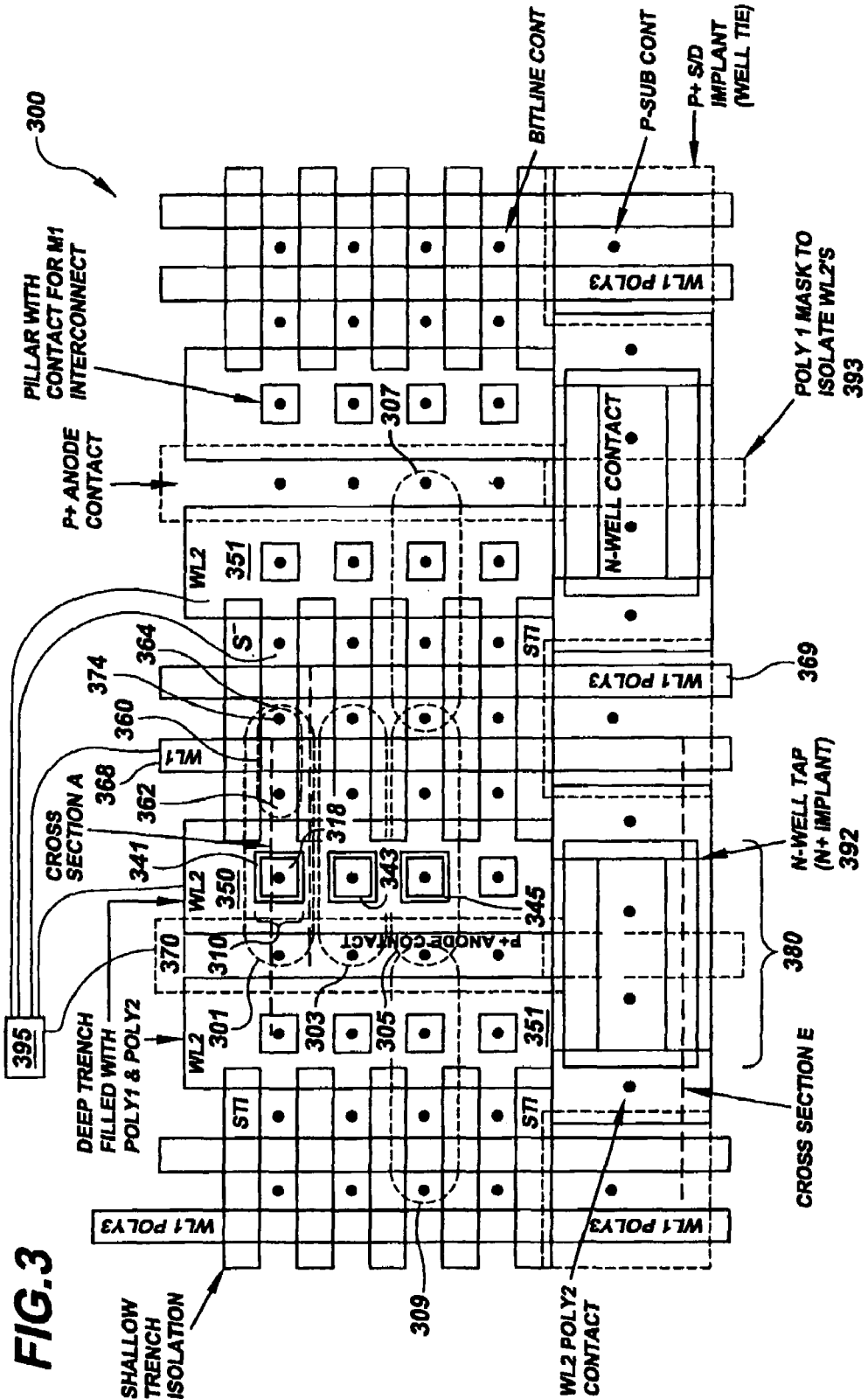
FIG. 3 is a top-down view of an array of thyristor-based semiconductor devices, according to another example embodiment of the present invention.

FIG. 3 is a memory array 300 including individual memory cells having thyristor-based semiconductor devices and other circuitry with portions thereof being separated and electrically insulated from other memory cells, according to another example embodiment of the present invention. FIG. 2 (discussed above) and FIG. 4 (discussed below) illustrate example cross-sections that may be implemented in connection with cross-section A of FIG. 3. Similarly, FIG. 5, discussed below, illustrates an example cross-section that may be implemented in connection with cross-section E of FIG. 3. Reference may be made to these example cross-sections for example implementations of the memory array 300, and for further exemplary description and views of certain elements of the memory array 300.

Referring to FIG. 3, the memory array 300 includes a plurality of adjacent memory cells including cells 301, 303, 305, 307 and 309, with certain discussion of various cells shown in the memory array 300 omitted for brevity. Cells 301, 303 and 305 run in parallel with portions of a second word line (WL2) 350 and insulative liner material 341, 343 and 345, respectively disposed between cells and in a trench region 380. The trench region 380 includes WL2 350, another WL2 351, conductive filler material and insulative material, correspondingly around thyristor body regions and pass device regions, for example, as shown in FIG. 2.

Referring to memory cell 301 as a representative sample cell of the array 300, a thyristor (e.g., a thin capacitively-coupled thyristor) having a body region 310 is electrically coupled in series with a pass device 360. Specifically, an upper emitter region 318 of the thyristor body region 310 is coupled via a local interconnect to a source/drain region 362 of the pass device 360. The thyristor body region 310 may, for example, be implemented in a manner similar to the body region 210 shown in FIG. 2, with upper emitter region 218 corresponding to the upper emitter region 318, with other base and emitter regions below the upper emitter region 218 as discussed above. The pass device 360 includes a gate (WL1) 368 that controls current flow between source/drain regions 362 and 364, with source/drain region 364 being electrically coupled to a bit line (not shown) via a bit line contact 374. With a signal applied to WL1 368, an electrical connection is made between an upper emitter of the thyristor body region 310 and the bit line 374.

A control port that is part of WL2 350 is arranged for capacitively coupling, via the insulative material 341, to an upper base region of the thyristor body 310 that is immediately below the upper emitter region 318. The thyristor body region 310 further includes a lower base region immediately below and coupled to the upper base region, and a lower emitter region immediately below and coupled to the lower base region. The lower emitter region is electrically coupled to an emitter contact 370 (e.g., a current shunt) below WL2 350, with the emitter contact 370 being electrically coupled to a reference voltage (Vref) node, such as a voltage supply or a ground. Capacitive coupling from WL2 350 to the upper base region is used to control current flow in the thyristor body region. In response to signals applied to WL1 368 and WL2 350, as well as to the emitter contact 370 and bit line contact 374, access to the upper emitter of the thyristor body 310 is controlled for accessing and/or manipulating data stored therein. For more information regarding data storage and manipulation with a thyristor-based device, such as those shown in the memory array 300, and in particular for controlling current in a thyristor-based device (or memory cell) with a capacitively-coupled control port, reference may be made to U.S. Pat. No. 6,229,161 (Nemati et al.).

The memory array 300 further includes an N-well contact 392 extending to a buried N-well region (e.g., region 404 of FIG. 5, below), with the N-well contact 392 optionally being repeated (e.g., every 8 cells having a common WL2). Near the N-well contact 392, an upper portion of the conductive filler material extends between WL2 350 and 351; an example of this extending upper portion is shown as portion 531 in FIG. 5 (discussed in more detail below). This upper portion of the conductive filler material may, for instance, be formed using deposition in the trench 380 and subsequent masking of the upper portion (e.g., via mask 393) when etching back the filler material to form a lower portion thereof over which the WL2s are to be formed. Similarly, one or more conductive contacts extend to the aforementioned conductive filler material in the trench 380 (e.g., similar to filler material 230 in FIG. 2), with a contact optionally being repeated (e.g., every 32-72 cells). The conductive contact to the filler material is coupled to a circuit node, for example, for preventing the conductive filler material from charging.

In a more particular implementation, the memory array 300 further includes an array-access controller 395 coupled to one or more of the control ports, bit line contacts and emitter contacts. The array-access controller 395 is adapted for controlling memory cells in the array 300 for read and write access, such as discussed above, and is readily implemented in one or more of a variety of commonly-used memory applications.

Figure 4:
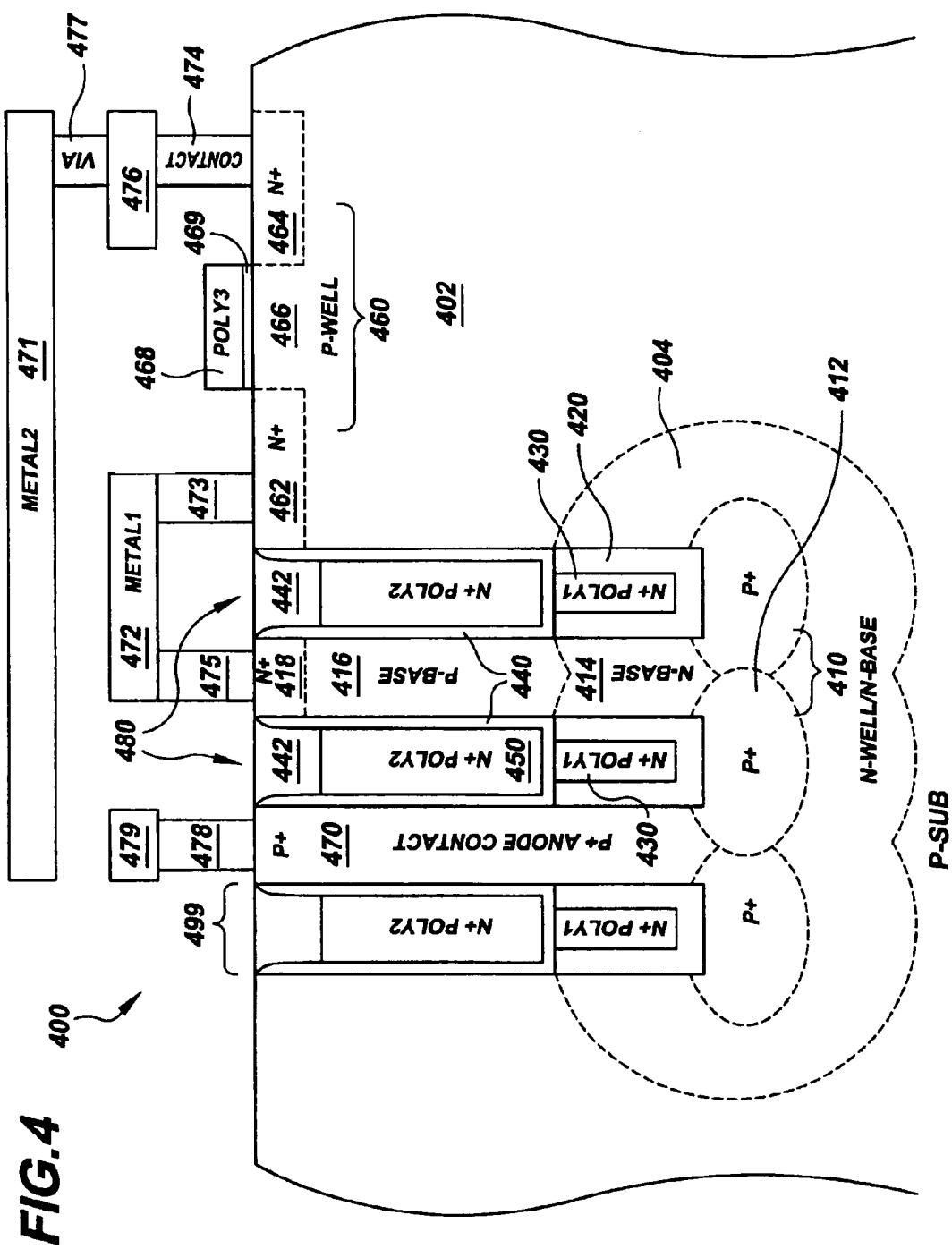
FIG. 4 is an example cross-section of a thyristor-based semiconductor device, according to another example embodiment of the present invention.

FIG. 4 is a cross-sectional view of a thyristor-based semiconductor device 400, according to another example embodiment of the present invention. As discussed above, the device 400 may be implemented in connection with cross-section A of the memory array 300 shown in FIG. 3. The device 400 includes a substrate 402 doped with a P dopant and having a trench region 480 around a thyristor body region 410. A portion of a similar trench region 499 (e.g., for an adjacent memory cell) is shown having similar features to the trench region 480, with discussion thereof omitted for brevity. The device 400 includes a thyristor having the body region 410 and a control port 450 in the trench 480, with the thyristor body region 410 being coupled in series with a pass device 460, shown here implemented as a MOSFET.

The thyristor body region 410 includes various doped portions in the substrate 402, with portions thereof being electrically insulated from other circuitry via the trench 480. Specifically, the thyristor body region 410 includes P+ emitter region 412, N base region 414, P base region 416 and N+ emitter region 418, with the control port 450 being arranged for capacitively coupling to the P base region 416 for controlling current flow in the thyristor body region 410. The P+ emitter region 412 is coupled to a P+ anode contact 470 extending from the P+ emitter region to an upper surface of the substrate 402, which is particularly useful for making electrical contact to the P+ emitter region 412 readily accessible by way of a via 478 and metal layer portion 479. The N+ emitter region 418 is coupled to a source/drain region 462 of the pass device 460 using metal to substrate contacts 473 and 475 and a first layer of metal for interconnect 472.

The pass device 460 includes the source/drain region 462 and another source/drain region 464 separated by a channel region 466 in the substrate 402. A gate dielectric material 469 is disposed over the channel region 466, and a gate 468 over the gate dielectric material 469 is arranged to capacitively couple to the well region via the gate dielectric material 469. The source/drain region 464 is coupled to a bit line 471 using via contacts 474 and 477 on opposite sides of a portion 476 of a first metal layer.

The trench 480 extends around the thyristor body 410 and includes an insulative liner material 420, such as oxide, and a conductive filler material 430 near a bottom portion of the trench. A portion of the trench 480 over the conductive filler material 430 includes an insulative liner 440 (e.g., dielectric material) and the control port 450, with the control port 450 being capacitively coupled to the P base region 416 via the insulative liner 440. Additional insulative material 442 fills an upper portion of the trench 480 over the control port 450.

The device 400 can be formed in a variety of manners. In one implementation, the P+ anode contact 470 is first implanted in the substrate 402, with the trench 480 being subsequently etched. The P+ anode contact is then annealed to drive P+ dopants into the substrate 402. After annealing the P+ anode contact, sidewall spacer material is formed in the trench 480 and an N base (well) region 404 is doped in the substrate 402 via a bottom portion of the trench 480. The N base 404 is also annealed and further forms N base region 414 of the thyristor body 410. A P+ emitter region 412 is then implanted via a bottom portion of the trench 480 and sidewall spacer material in the trench is removed.

After implants via the trench are complete, the insulative liner material 420 is formed in the trench 480, followed by deposition of a first polysilicon filler material 430 on the insulative liner material. The polysilicon filler material 430 is then masked and etched back to the height in the trench shown, with an upper portion thereof being unetched (not shown in FIG. 4, but similar, e.g., to upper portion 531 shown in FIG. 5). Portions of the insulative liner material 420 over the polysilicon filler material are then removed, using the polysilicon filler material as an etch stop. The insulative liner 440 (e.g., gate oxide) is then formed in an upper portion of the trench, followed by deposition and etch back of a second polysilicon material to form the control port 450. The etch back of the second polysilicon material may include, for example, a first etch that removes the second polysilicon material to a level even with an upper surface of the substrate 402. Alternately, similar processes, such as chemical-mechanical polishing (CMP), can be used instead of the first etch. A second etch is then used to recess the control port 450 below adjacent source/drain region 462. In one implementation, the first and/or second etch back of the control port material 450 is masked such that a portion of the second polysilicon material extends to the upper surface, e.g., for connection to interconnect layers such as a metal layer. Additional insulator material 442 is then formed in the trench 480 and subsequently planarized with CMP or another process so that it is level with the surface of the substrate 402. Additional implants are then carried out to form P base region 416 and N+ regions 414, 462 and 464, with the local interconnect 472, gate 468 and bit line contact 474 being formed over the substrate 402 using conventional approaches.

Figure 5:
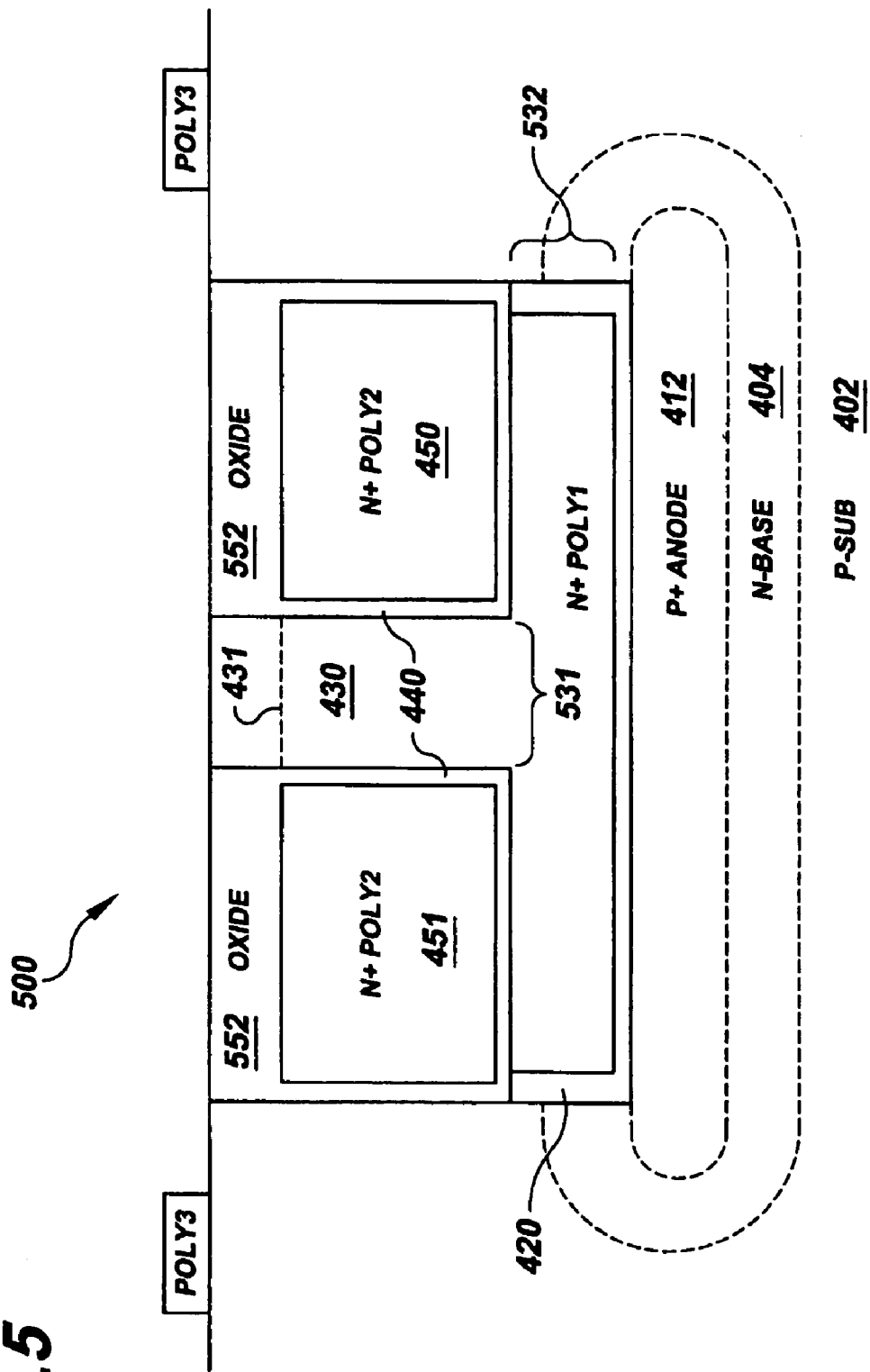
FIG. 5 is another example cross-section of a portion of a thyristor-based semiconductor device, according to another example embodiment of the present invention.

FIG. 5 shows an example cross-sectional view of a portion 500 of a filled trench that can be implemented in connection with cross-section E of the memory array shown in FIG. 3 and with the device 400 shown in FIG. 4, according to another example embodiment of the present invention. Conductive filler material 430 having upper portion 531 and lower portion 532 is formed over insulative material 420, N base region 404 and P+ anode region 412 (e.g., with the P+ anode region 412 coupling adjacent cells 301, 303 and 305 of FIG. 3). Insulative material 440 is formed on sidewalls of the upper portion 531, on an upper surface of the lower portion 532 and on the sidewalls of the trench portion 500. Laterally-adjacent control ports 450 and 451 are separated and electrically insulated from each other by the upper portion 531 of the conductive filler material 430 and the insulative liner material 440. Referring to FIG. 3, the control ports 450 and 451 may, for example, correspond to control ports 350 and 351 of memory cells 305 and 309.

Insulative material 552 over the control ports 450 and 451 and over the conductive filler material 430 electrically insulates active regions of adjacent pass devices. In one implementation, the conductive filler material 430 is recessed below an upper surface of the substrate 402, as shown by dashed line 431. With this approach, the conductive filler material 430 is recessed below the upper surface of the substrate 402 such that the upper portion 531 of the conductive filler material 430 is insulated by the insulative material 552 from circuits on or near the upper surface. In this regard, any process misalignment of features such as interconnects and other conductive elements near the upper surface of the substrate 402 can be prevented from shorting to the conductive filler material 430.

As an alternative approach, any of the above embodiments can be modified using the approach(es) illustrated and described in concurrently-filed U.S. patent application Ser. No. 10/262,792 entitled "Method of Manufacturing a Thyristor Device with a Control Port in a Trenc," and Provisional Patent Application Ser. No. 60/415,356, entitled "Novel Minority Carrier Isolation Device."

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and conductive filler materials; adding structures to the devices; increasing the number of PN body sections in the thyristor; and interchanging P and N regions (e.g., for cathode-down and anode-down vertical implementations), replacing one of the isolated thyristor control ports in a filled trench with another capacitance device (e.g., a transistor gate) and/or interchanging PMOSFETS with NMOSFETS. In addition, for general information regarding thyristors including thin capacitively-coupled thyristors, and for particular information regarding implementations to which the present invention is applicable and their respective operations, reference may be made to U.S. Pat. No. 6,229,161, which is fully incorporated herein by reference. Such modifications and changes do not depart from the true spirit and scope of the present invention that is set forth in the following claims.

What is claimed is:

1. A method for manufacturing a thyristor-based semiconductor device having a substrate, a thyristor and a pass device, wherein at least one body region of the thyristor is in the substrate, the method comprising:

removing a portion of the substrate and forming a trench in the substrate and laterally adjacent to said at least one thyristor body region;

forming an insulative material in the trench;

forming conductive filler material in the trench;

masking a first portion of the conductive filler material and etching an unmasked portion of the conductive filler material, thereby forming upper and lower portions of the conductive filler material;

forming an insulative liner material on the etched conductive filler material; and forming at least two adjacent thyristor control ports in the trench and separated from one another by a portion of the upper conductive filler material, at least one of the thyristor control ports being adapted for capacitively coupling to the thyristor body region in the substrate and for controlling current in the thyristor body, wherein the insulative material and the conductive filler material are configured and arranged to electrically insulate the adjacent thyristor control ports from each other.

2. The method of claim 1, wherein forming at least two adjacent thyristor control ports includes forming the thyristor control ports over a lower portion of the conductive filler material.

3. The method of claim 2, wherein forming the thyristor control ports over a lower portion of the conductive filler material includes forming the thyristor control ports on a portion of the insulative liner material formed on the etched conductive filler material.

4. The method of claim 1, wherein removing a portion of the substrate and forming the trench includes forming a trench having a height:width aspect ratio that is greater than about 2:1.

5. The method of claim 1, wherein forming conductive filler material in the trench includes recessing the conductive filler material below an upper surface of the substrate, further comprising forming a second insulative material over the recessed conductive filler material and electrically insulating the conductive filler material from circuitry near the upper surface of the substrate.

6. The method of claim 1, further comprising forming a current shunt extending from a buried circuit region of the thyristor and an upper surface of the substrate.

7. The method of claim 6, wherein forming an insulative material and forming conductive material in the trench includes forming the insulative material and conductive material such that they electrically insulate the current shunt from said adjacent thyristor control ports.

8. The method of claim 7, further comprising forming an N well contact extending from an N well region in the substrate to an upper surface of the substrate, wherein forming an insulative material and forming conductive material in the trench includes forming the insulative material and the conductive material such that they electrically insulate the current shunt from the N well contact.

9. The method of claim 1, further comprising forming an N well contact extending from an N well region in the substrate to an upper surface of the substrate.

* * * * *